US012712546B2

(12) United States Patent
Urayama et al.

(10) Patent No.: US 12,712,546 B2
(45) Date of Patent: Aug. 18, 2026

(54) INPUT DEVICE

(71) Applicant: Alps Alpine Co., Ltd., Tokyo (JP)

(72) Inventors: Shinya Urayama, Miyagi-ken (JP); Nobuyuki Tanabe, Miyagi-ken (JP); Tomomichi Shinkai, Guangdong Province (CN); Sachio Taguchi, Miyagi-ken (JP)

(73) Assignee: Alps Alpine Co., Ltd. (JP)

( * ) Notice: Subject to any disclaimer, the term of this patent is extended or adjusted under 35 U.S.C. 154(b) by 306 days.

(21) Appl. No.: 18/638,953

(22) Filed: Apr. 18, 2024

(65) Prior Publication Data

US 2024/0267048 A1 Aug. 8, 2024

Related U.S. Application Data

(63) Continuation of application No. PCT/JP2022/038952, filed on Oct. 19, 2022.

(30) Foreign Application Priority Data

Nov. 11, 2021 (JP) ................................ 2021-184136

(51) Int. Cl.
*H01H 13/14* (2006.01)
*H03K 17/96* (2006.01)

(52) U.S. Cl.
CPC ............. *H03K 17/96* (2013.01); *H01H 13/14* (2013.01); *H03K 2217/9655* (2013.01)

(58) Field of Classification Search
CPC ...... H01H 3/125; H01H 13/705; H01H 13/14; H01H 13/04; H01H 13/10; H01H 13/70; H01H 13/704; H01H 13/7065; H01H 13/7006; H01H 13/7057; H01H 13/78; H01H 13/79; H01H 13/52; H01H 13/703;
(Continued)

(56) References Cited

U.S. PATENT DOCUMENTS

2009/0140994 A1 6/2009 Tanaka et al.
2020/0105482 A1 4/2020 Kosugi et al.
(Continued)

FOREIGN PATENT DOCUMENTS

CN 112970086 A * 6/2021 ............ H01H 13/26
EP 1859992 A1 11/2007
(Continued)

*Primary Examiner* — Ahmed M Saeed
(74) *Attorney, Agent, or Firm* — Harness, Dickey & Pierce, P.L.C.

(57) ABSTRACT

An input device includes a chassis, a switch member provided inside of the chassis, a touch panel that is provided in a movable manner relative to the chassis in an up-down direction and that is exposed on the chassis to have a plurality of pressing operation regions, a slide member that includes a guided portion guided by the chassis in a movable manner in the up-down direction and that moves in a downward direction in accordance with a pressing operation performed on the pressing operation region, and a transmission member that is supported by the chassis in a rotatable manner and that rotates in accordance with movement of the slide member in the downward direction to press and turn on the switch member. The slide member is provided in a plurality such that each of the slide members corresponds to one of the pressing operation regions of the touch panel.

6 Claims, 14 Drawing Sheets

(58) Field of Classification Search
CPC ........ H01H 13/507; H01H 3/12; H01H 13/20; H01H 2003/466; H01H 2221/016; H01H 13/02; H01H 36/00; H03K 17/96; H03K 2217/9655
See application file for complete search history.

(56) References Cited

U.S. PATENT DOCUMENTS

| | | | | |
|---|---|---|---|---|
| 2021/0265119 | A1 | 8/2021 | Imai | |
| 2024/0013989 | A1* | 1/2024 | Zhou | H01H 13/14 |

FOREIGN PATENT DOCUMENTS

| | | | | |
|---|---|---|---|---|
| EP | 3992765 | A1 * | 5/2022 | G06F 3/04164 |
| JP | 2007-317393 | A | 12/2007 | |
| JP | 2009-135059 | A | 6/2009 | |
| JP | 2017-126505 | A | 7/2017 | |
| WO | 2020-137210 | A1 | 7/2020 | |

* cited by examiner

Z
Y
X
135
131
130-1
131
131
131
150
135
131
130-2
131
A
135
130-3
131
130-4
131
131
135
135
131
131
130-5
131
131
130-6
131
131
135

INPUT DEVICE

CLAIM OF PRIORITY

This application is a Continuation of International Application No. PCT/JP2022/038952 filed on Oct. 19, 2022, which claims benefit of Japanese Patent Application No. 2021-184136 filed on Nov. 11, 2021. The entire contents of each application noted above are hereby incorporated by reference.

BACKGROUND OF THE INVENTION

1. Field of the Invention

The present invention relates to an input device.

2. Description of the Related Art

International Publication No. 2020/137210 relating to an input device described below discloses a configuration in which, when a user performs a press-down operation on an operation unit, an operating member is pressed down inside of a casing and, thus, a rotating member of a link mechanism rotates, which presses a push switch provided on the lower surface of a circuit board and turns on the push switch.

However, the input device described in International Publication No. 2020/137210 includes a single operating member and, in addition, the operating member is relatively large because the size of the operating member is substantially the same as that of an electrostatic sensor in plan view viewed from above. For this reason, according to the input device described in International Publication No. 2020/137210, when a pressing operation is performed on one end of the electrostatic sensor, a guided portion at one end of the slide member near the pressing operation position can easily slide downward because the sliding load is small. However, a guided portion at the other end of the slide member, which is far from the pressing operation position, has a large sliding load and, thus, cannot easily slide downward. Therefore, in the input device described in International Publication No. 2020/137210, a rotational moment is generated in the entire slide member, so that the entire member is tilted. For this reason, the load generated when an end portion is subjected to a pressing operation is larger than when the center region is subjected to a pressing operation.

SUMMARY OF THE INVENTION

An input device according to one embodiment includes a chassis, a switch member provided inside of the chassis, a touch panel provided in a movable manner relative to the chassis in an up-down direction, where the touch panel is exposed on the chassis and has a plurality of pressing operation regions, a slide member including a guided portion guided by the chassis in a movable manner in the up-down direction, where the slide member moves in a downward direction in accordance with a pressing operation performed on the pressing operation region of the touch panel, and a transmission member supported by the chassis in a rotatable manner, where the transmission member rotates in accordance with movement of the slide member in the downward direction and presses the switch member to turn on the switch member. The slide member is provided in a plurality, and each of the slide members corresponds to one of the plurality of pressing operation regions of the touch panel.

According to one embodiment, the generation of a rotational moment of the slide member can be reduced when an off-center position of the touch panel is subjected to a pressing operation, and the load related to the pressing operation can be reduced.

DESCRIPTION OF THE PREFERRED EMBODIMENTS

One embodiment is described below with reference to the accompanying drawings.

Overview of Input Device

Figure 1:
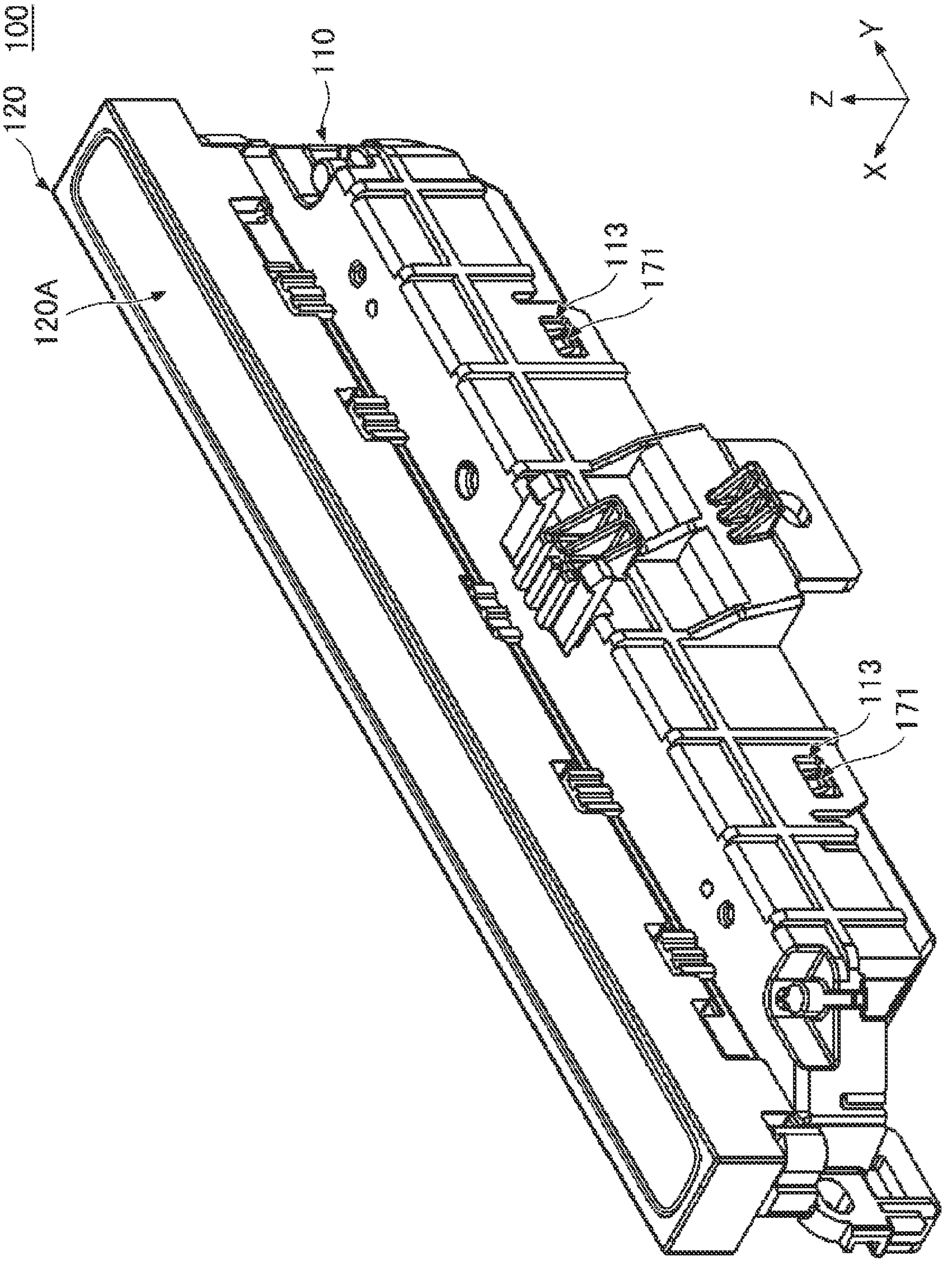
FIG. 1 is an external perspective view of an input device according to one embodiment.
Figure 2:
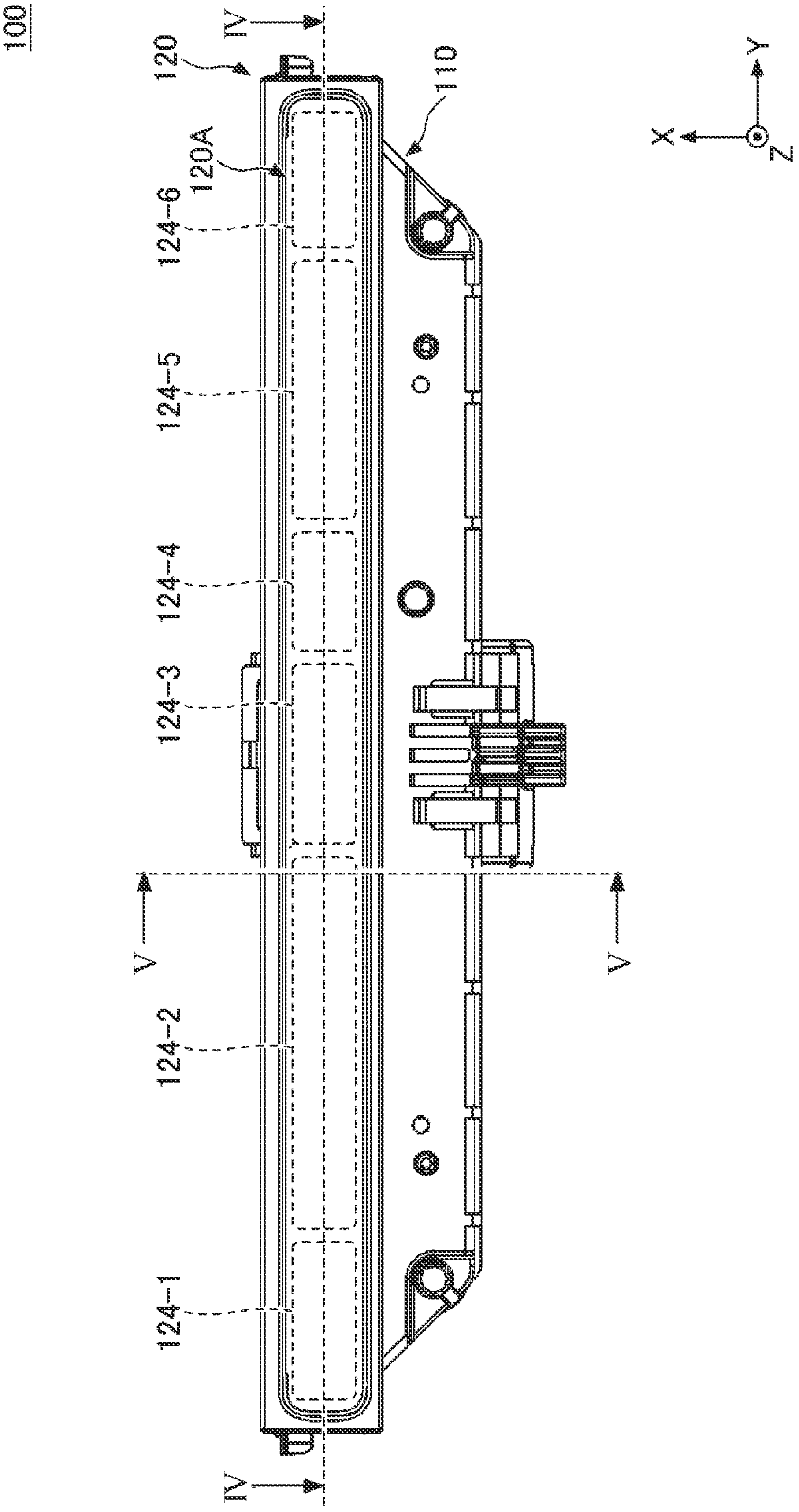
FIG. 2 is a plan view of an input device according to one embodiment.

FIG. 1 is an external perspective view of an input device 100 according to one embodiment. FIG. 2 is a plan view of the input device 100 according to one embodiment. Hereinafter, for convenience of description, the X-axis direction is the front-rear direction, the Y-axis direction is the left-right direction, and the Z-axis direction is the up-down direction. However, the positive X-axis direction is the frontward direction, the positive Y-axis direction is the right direction, and the positive Z-axis direction is the upward direction. These terms are not limited to the installation direction and the operation direction of the device. Devices including elements having the same relative positional relationship in the devices are encompassed within the scope of the present invention even if the installation directions or the operation directions are different.

The input device 100 illustrated in FIGS. 1 and 2 is installed in, for example, the interior of a vehicle, such as an automobile, and is used for various switching operations performed for the vehicle. As illustrated in FIGS. 1 and 2, the input device 100 includes a touch panel 120 in the uppermost portion of the chassis 110. The touch panel 120 has a horizontally long rectangular shape having a longitudinal direction extending in the left-right direction (the Y-axis direction) in plan view viewed from above (in the positive Z-axis direction). An operation surface 120A also having a horizontally long rectangular shape is provided on the upper surface of the touch panel 120.

A plurality of pressing operation regions 124 (124-1 to 124-6) are formed on the operation surface 120A so as to be arranged in a line in the left-right direction (the Y-axis direction), and a function related to an operation is assigned to each of the plurality of pressing operation regions 124. A user can execute one of the functions corresponding to one of the pressing operation regions 124 by performing a pressing operation on the desired pressing operation region 124.

The input device 100 detects whether any one of the pressing operation regions 124 of the operation surface 120A is selected by using the touch panel 120. When a pressing operation is performed on the selected pressing operation region 124, the entire touch panel 120 moves downward (in the negative Z-axis direction) and, therefore, a switch 151A (refer to FIGS. 3 to 5) provided inside of the chassis 110 is pressed and is turned on. Thus, the input device 100 determines that selection of the detected pressing operation region 124 is made through the pressing operation.

At this time, the input device 100 can control the function corresponding to the determined pressing operation region 124.

Configuration of Input Device

Figure 3:
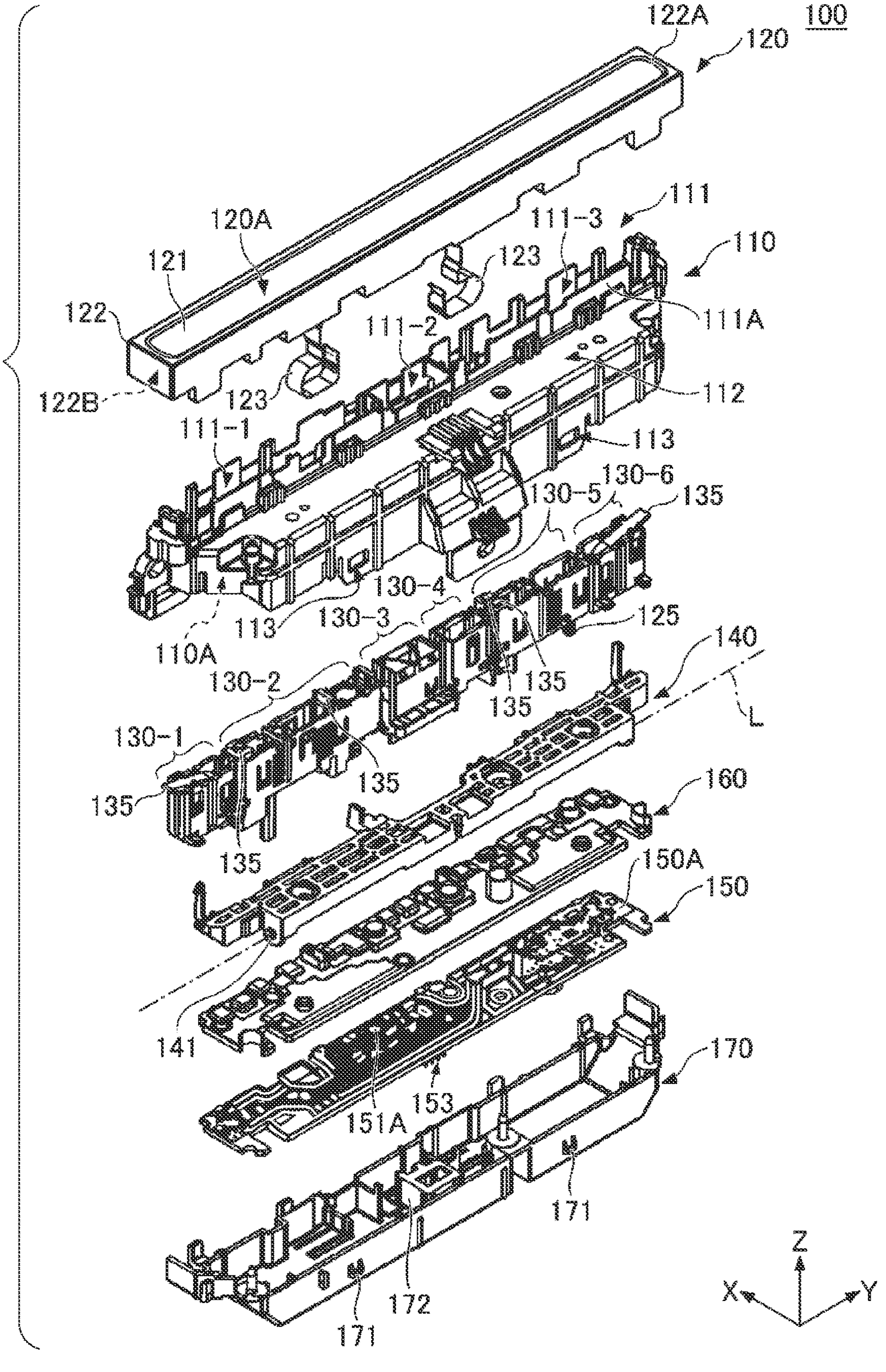
FIG. 3 is an exploded perspective view of an input device according to one embodiment.
Figure 4:
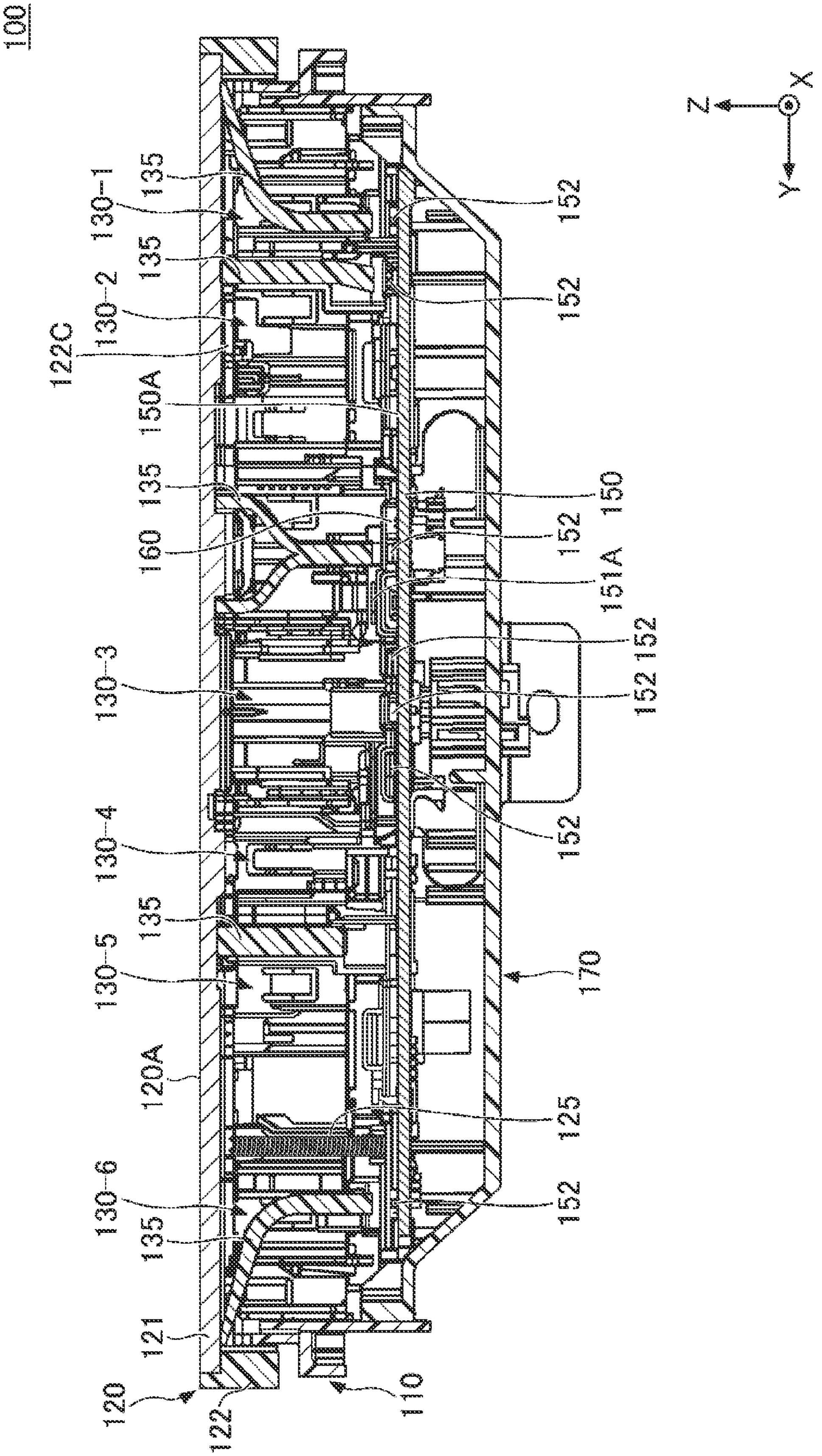
FIG. 4 is a cross-sectional view of the input device taken along a line IV-IV of FIG. 2, according to one embodiment.
Figure 5:
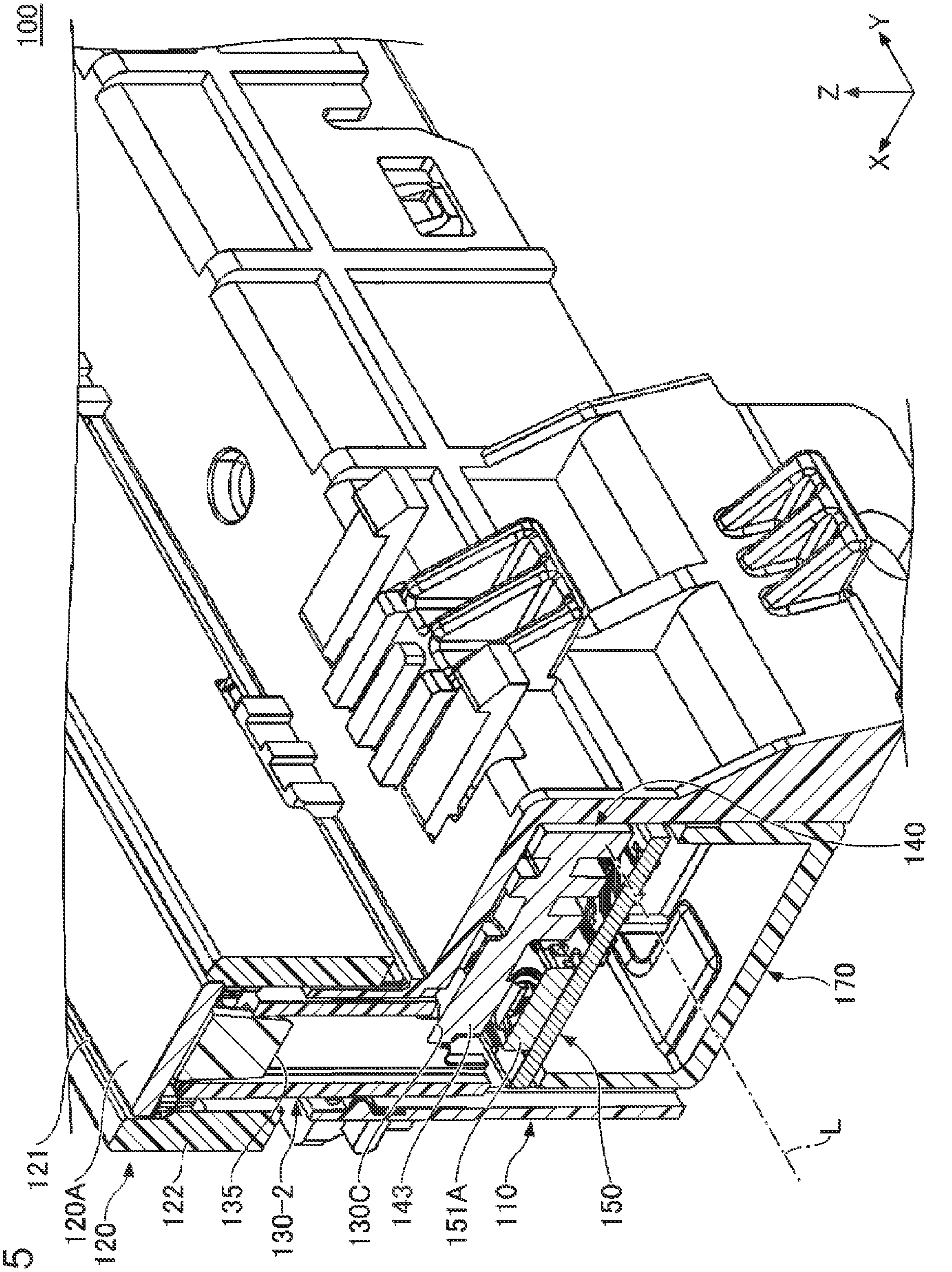
FIG. 5 is a cross-sectional perspective view of the input device taken along a line V-V of FIG. 2, according to one embodiment.
Figure 6:
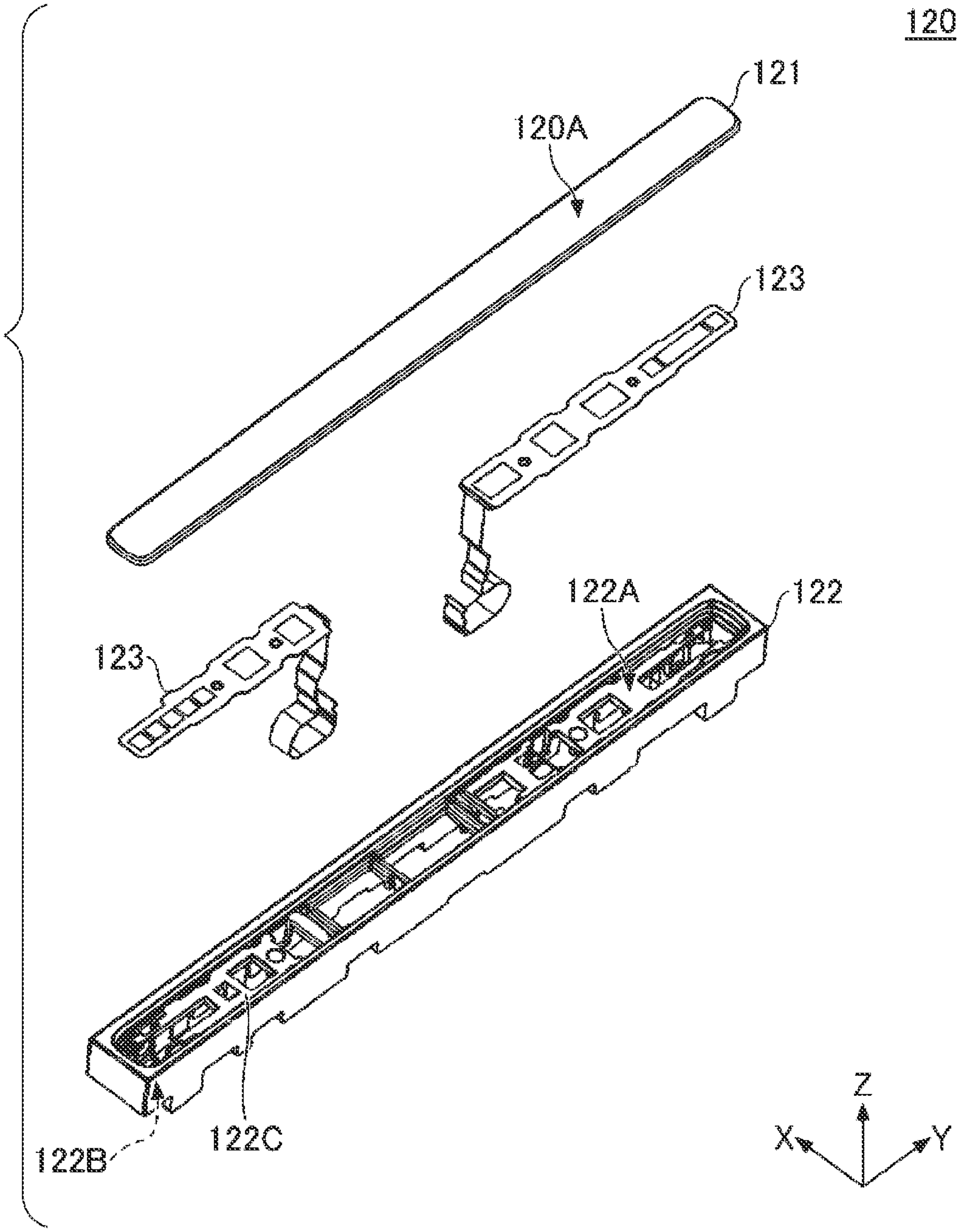
FIG. 6 is an exploded perspective view of a touch panel of an input device according to one embodiment.

FIG. 3 is an exploded perspective view of the input device 100 according to one embodiment. FIG. 4 is a cross-sectional view of the input device 100 taken along a line A-A of FIG. 2, according to one embodiment. FIG. 5 is a cross-sectional perspective view of the input device 100 taken along a line B-B of FIG. 2, according to one embodiment. FIG. 6 is an exploded perspective view of the touch panel 120 included in the input device 100 according to one embodiment.

As illustrated in FIG. 3, the input device 100 includes the chassis 110, the touch panel 120, six sliders 130 (sliders 130-1 to 130-6), a transmission member 140, a substrate 150, a rubber sheet 160, and a cover 170.

Touch Panel

The touch panel 120 is provided in the uppermost portion of the input device 100 and receives a pressing operation from an operator. The touch panel 120 has a cuboid shape with an open bottom. The touch panel 120 has a horizontally long rectangular shape in plan view viewed from above (in the positive Z-axis direction) with the longitudinal direction extending in the left-right direction (the Y-axis direction) and the transverse direction extending in the front-rear direction (the X-axis direction). The touch panel 120 is supported by the chassis 110 via the slider 130 in a movable manner in the up-down direction (the Z-axis direction). The operation surface 120A is provided on the upper surface of the touch panel 120 to receive a pressing operation. The operation surface 120A has the plurality of pressing operation regions 124. For example, according to the present embodiment, as illustrated in FIG. 2, the operation surface 120A has the six pressing operation regions 124-1 to 124-6 arranged in a straight line extending in the left-right direction (the Y-axis direction). A peripheral wall part 111A of a tubular portion 111 of the chassis 110 is inserted into the touch panel 120 through a lower opening portion 122B of the touch panel 120, so that the touch panel 120 is supported by the peripheral wall part 111A in a movable manner in the up-down direction (the Z-axis direction). As a result, the touch panel 120 can move downward (in the negative Z-axis direction) when a pressing operation is performed on the operation surface 120A of a touch panel body 121.

As illustrated in FIG. 6, the touch panel 120 includes the touch panel body 121 that is flat, a frame 122 that holds the touch panel body 121, and a pair of left and right FPCs 123. The touch panel body 121 is a sheet-like member. The touch panel body 121 has a horizontally long rectangular shape in plan view viewed from above (in the positive Z-axis direction) with the longitudinal direction extending in the left-right direction (the Y-axis direction). The touch panel body 121 uses a variety of detection methods (for example, an electrostatic detection method) to detect the contact position of an operating body (for example, a user's finger) with the surface (the operation surface 120A) of the touch panel body 121. The frame 122 is a cuboid resin member having the lower opening portion 122B at the bottom. The upper surface of the frame 122 has a depressed portion 122A formed thereon. The depressed portion 122A has substantially the same shape as the touch panel body 121 (that is, a horizontally long rectangular shape). At the bottom of the depressed portion 122A, a horizontal plate portion 122C that is horizontal to the XY plane is provided, and the touch panel body 121 is placed on and fixed to the upper surface of the horizontal plate portion 122C. Thus, the operation surface 120A is formed on the upper surface of the frame 122 to receive a pressing operation. The pair of FPCs 123 are film-like wiring members. According to the present embodiment, the FPCs 123 are electrostatic detection sensors that detect the position of contact with the operating body. The pair of FPCs 123 are disposed so as to be stacked on the rear surface of the touch panel body 121 and extend downward from the touch panel body 121. The pair of FPCs 123 are electrically connected to the outside and the touch panel body 121 to transmit a signal, such as a signal indicating the contact position of the operating body, between the outside and the touch panel body 121.

The touch panel 120 is urged upward (in the positive Z-axis direction) by a coil spring 125 (refer to FIG. 4), which is disposed through the slider 130-5. This allows the touch panel 120 to move upward (in the positive Z-axis direction) and return to the initial position when a pressing operation against the operation surface 120A is released.

Chassis

As illustrated in FIG. 3, the chassis 110 is a container-shaped, resin component having a hollow structure. The chassis 110 has thereinside the six sliders 130, the transmission member 140, the substrate 150, and the rubber sheet 160. In the upper portion of the chassis 110, a touch panel 120 is disposed in a slidable manner in the up-down direction (the Z-axis direction). The entire portion of the chassis 110 corresponding to the bottom surface is a lower opening portion 110A. The lower opening portion 110A is closed by the cover 170. The chassis 110 has a shape with the longitudinal direction extending in the left-right direction (the Y-axis direction) and the transverse direction extending in the front-rear direction (the X-axis direction) in plan view viewed from above.

A front (the positive X-axis side) portion of the chassis 110 is provided with the tubular portion 111 that penetrates the chassis 110 in the up-down direction. The entire tubular portion 111 has a rectangular shape with the longitudinal direction extending in the left-right direction (the Y-axis direction) in plan view viewed from above (in the positive Z-axis direction). Inside the tubular portion 111, the six sliders 130-1 to 130-6 are arranged in the left-right direction (the Y-axis direction) in a slidable manner in the up-down direction (the Z-axis direction).

The tubular portion 111 is divided into a first tubular portion 111-1, a second tubular portion 111-2, and a third tubular portion 111-3. The second tubular portion 111-2 is provided in the center in the left-right direction (the Y-axis direction). The slider 130-3 is disposed inside of the second tubular portion 111-2. The first tubular portion 111-1 is provided on the left side (the negative Y-axis side) of the second tubular portion 111-2. The sliders 130-1 and 130-2 are disposed inside of the first tubular portion 111-1. The third tubular portion 111-3 is provided on the right side (the positive Y-axis side) of the second tubular portion 111-2. The sliders 130-4, 130-5, 130-6 are disposed inside of the third tubular portion 111-3.

The tubular portion 111 includes the peripheral wall part 111A that protrudes upward more than a housing portion 112. The peripheral wall part 111A is inserted into the touch panel 120 through the lower opening portion 122B of the touch panel 120 to support the touch panel 120 in a movable manner in the up-down direction (the Z-axis direction).

In the rear (the negative X-axis side) portion of the chassis 110, the housing portion 112 is provided that has a horizontally long shape and has a hollow structure with the longitudinal direction extending in the left-right direction (the Y-axis direction). The transmission member 140 is disposed inside of the housing portion 112 in a rotatable manner.

Slider

As illustrated in FIG. 3, the six sliders 130-1 to 130-6 are each examples of "slide members" and are resin components that are arranged in the left-right direction (the Y-axis direction, an example of "the direction of the rotation center axis of the transmission member") inside of the tubular portion 111 of the chassis 110. Each of the sliders 130 has a substantially rectangular tube shape with the tube axis direction extending in the up-down direction (the Z-axis direction). Each of the sliders 130 is disposed inside of the tubular portion 111 of the chassis 110 in a slidable manner in the up-down direction (the Z-axis direction).

The slider 130-1 is disposed below the pressing operation region 124-1 (refer to FIG. 2) of the operation surface 120A. When a pressing operation is performed on the pressing operation region 124-1, the slider 130-1 is pressed downward (in the negative Z-axis direction) by the operating force of the pressing operation.

The slider 130-2 is disposed below the pressing operation region 124-2 (refer to FIG. 2) of the operation surface 120A. When a pressing operation is performed on the pressing operation region 124-2, the slider 130-2 is pressed downward (in the negative Z-axis direction) by the operating force of the pressing operation.

The slider 130-3 is disposed below the pressing operation region 124-3 (refer to FIG. 2) of the operation surface 120A. When a pressing operation is performed on the pressing operation region 124-3, the slider 130-3 is pressed downward (in the negative Z-axis direction) by the operating force of the pressing operation.

The slider 130-4 is disposed below the pressing operation region 124-4 (refer to FIG. 2) of the operation surface 120A. When a pressing operation is performed on the pressing operation region 124-4, the slider 130-4 is pressed downward (in the negative Z-axis direction) by the operating force of the pressing operation.

The slider 130-5 is disposed below the pressing operation region 124-5 (refer to FIG. 2) of the operation surface 120A. When a pressing operation is performed on the pressing operation region 124-5, the slider 130-5 is pressed downward (in the negative Z-axis direction) by the operating force of the pressing operation.

The slider 130-6 is disposed below the pressing operation region 124-6 (refer to FIG. 2) of the operation surface 120A. When a pressing operation is performed on the pressing operation region 124-6, the slider 130-6 is pressed downward (in the negative Z-axis direction) by the operating force of the pressing operation.

The horizontal plate portion 122C of the frame 122 of the touch panel 120 is stacked on the upper surface of each of the plurality of sliders 130. As a result, according to the input device 100 of one embodiment, when the pressing operation region 124 of the touch panel 120 is pressed down by a pressing operation, the horizontal plate portion 122C having the touch panel body 121 fixed thereto is pressed down. As a result, the horizontal plate portion 122C can press down (in the negative Z-axis direction) the slider 130 located at the position corresponding to the pressure position of the pressing operation region 124, that is, the position directly below the pressure position or in its vicinity. The operation surface 120A, the touch panel body 121, and the horizontal plate portion 122C are molded products made of resin or the like and, thus, are not completely rigid and have some elasticity. Therefore, from a microscopic viewpoint, in the initial stage of the pressing motion, the slider 130 corresponding to the pressed region first moves downward not only when both ends of the touch panel body 121 are pressed, but also when a part at any location is pressed. Thereafter, as the amount of pressure increases, each of the sliders 130 adjacent to the slider 130 is also gradually pressed by the horizontal plate portion 122C and moves downward. The configuration of each of the sliders 130 is described in detail below.

Transmission Member

Figure 7:
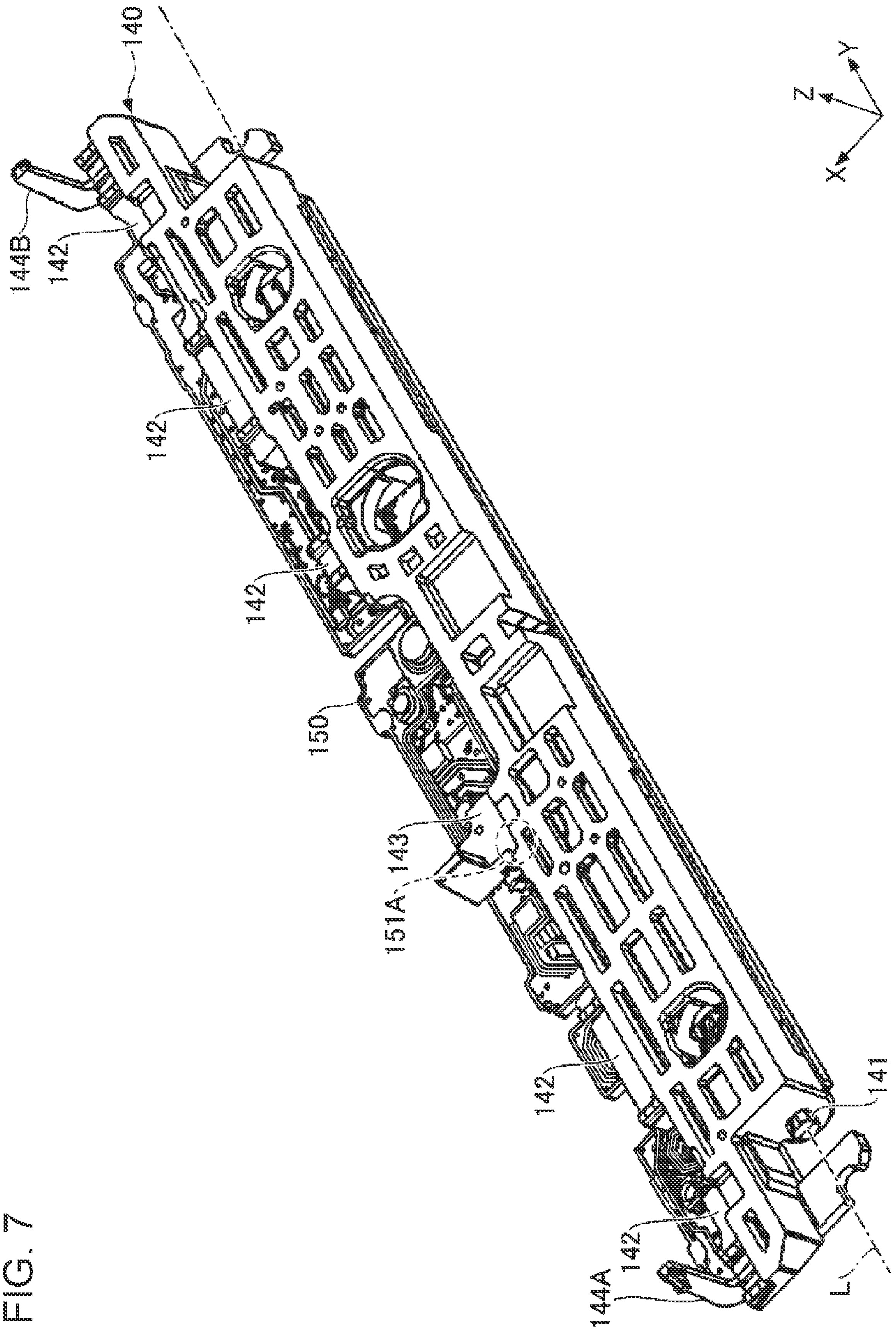
FIG. 7 is an external perspective view of a transmission member of an input device according to one embodiment.

As illustrated in FIGS. 3 and 7, the transmission member 140 is a plate-shaped resin member that extends longitudinally in the left-right direction (the Y-axis direction) and has a constant thickness in the up-down direction (the Z-axis direction). The transmission member 140 has a pair of convex shaft portions 141 (the other shaft portion 141 is not illustrated) at the rear end of the left side surface and the rear end of the right side surface. The transmission member 140 is disposed inside of the housing portion 112 on the rear side (the negative X-axis side) of the chassis 110. Each of the paired left and right shaft portions 141 of the transmission member 140 is supported by the chassis 110. Thus, the transmission member 140 is supported by the chassis 110 inside of the housing portion 112 in a rotatable manner in the up-down direction (the Z-axis direction) about a rotation center axis L that is a straight line extending between the pair of shaft portions 141 in the Y-axis direction. When any one of the plurality of sliders 130 is moved downward (in the negative Z-axis direction) due to a pressing operation, the upper surface (in the positive Z-axis direction) of the pressed portion 142 is pressed down by a contact portion 130*c* of the slider 130 and, thus, the transmission member 140 rotates downward. Consequently, the lower surface of the pressing portion 143 (in the negative Z-axis direction) presses down a switch 151A mounted on an upper surface 150A of the substrate 150, and the switch 151A can be turned on (described in more detail below).

Substrate

The substrate 150 is a flat plate component. The substrate 150 has a horizontally long rectangular shape in plan view viewed from above (the positive Z-axis direction). The substrate 150 is fixedly mounted on the upper surface of the cover 170 inside of the chassis 110 so as to be horizontal to the XY plane. The switch 151A (an example of a "switch member"), a plurality of LEDs (Light Emitting Diodes) 152 (an example of a "light emitter"), and the like are mounted on the upper surface 150A of the substrate 150 (refer to FIG. 4). For example, a PWB (Printed Wiring Board) is used as the substrate 150.

Rubber Sheet

As illustrated in FIGS. 3 and 4, the rubber sheet 160 is a sheet-like member provided on top of the upper surface 150A of the substrate 150. The rubber sheet 160 is formed using an elastic material (for example, silicon rubber). The rubber sheet 160 covers the entire upper surface 150A of the substrate 150 and, thus, the rubber sheet 160 can prevent the upper surface 150A of the substrate 150 from getting wet with water even when the water enters the chassis 110. The surface of the rubber sheet 160 has a concavo-convex shape corresponding to the shapes of the plurality of electronic components mounted on the upper surface 150A of the substrate 150. The portion of the surface of the rubber sheet 160 facing the LED 152 has a high surface roughness, which transmits upward the light emitted by the LED 152.

Cover

As illustrated in FIGS. 3 and 4, the cover 170 is a container-shaped resin member and has an opening at the top. The cover 170 closes the lower opening portion 110A of the chassis 110 and supports the substrate 150 disposed in the chassis 110. The cover 170 is fitted into the lower opening portion 110A of the chassis 110, and a plurality of engagement claws 171 formed on the side surface of the cover 170 are fitted into a plurality of engagement holes 113 formed on the side surface of the chassis 110. Thus, the cover 170 is snap-fit fixed to the chassis 110. A rectangle tubular connector portion 172 is provided on the bottom surface of the cover 170. A plurality of connector pins 153 that hang down from the lower surface of the substrate 150 are disposed inside of the connector portion 172. An external connector is fitted into the connector portion 172 from the underside and, thus, the connector portion 172 allows the plurality of connector pins 153 to be electrically connected to the external connector.

Configuration Related to Pressing of Switch

Figure 8:
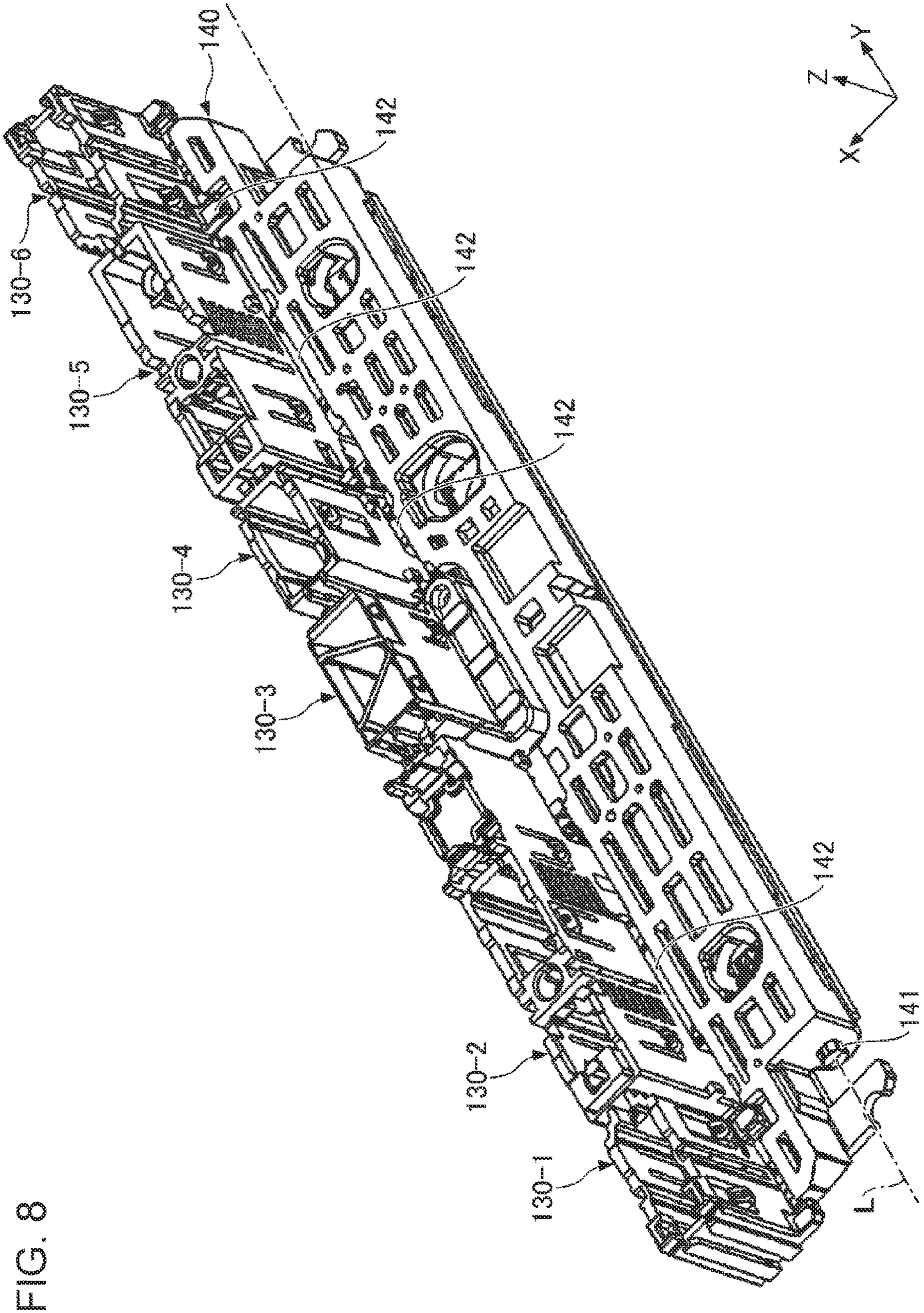
FIG. 8 illustrates a positional relationship between a slider and a transmission member of an input device according to one embodiment.
Figure 9:
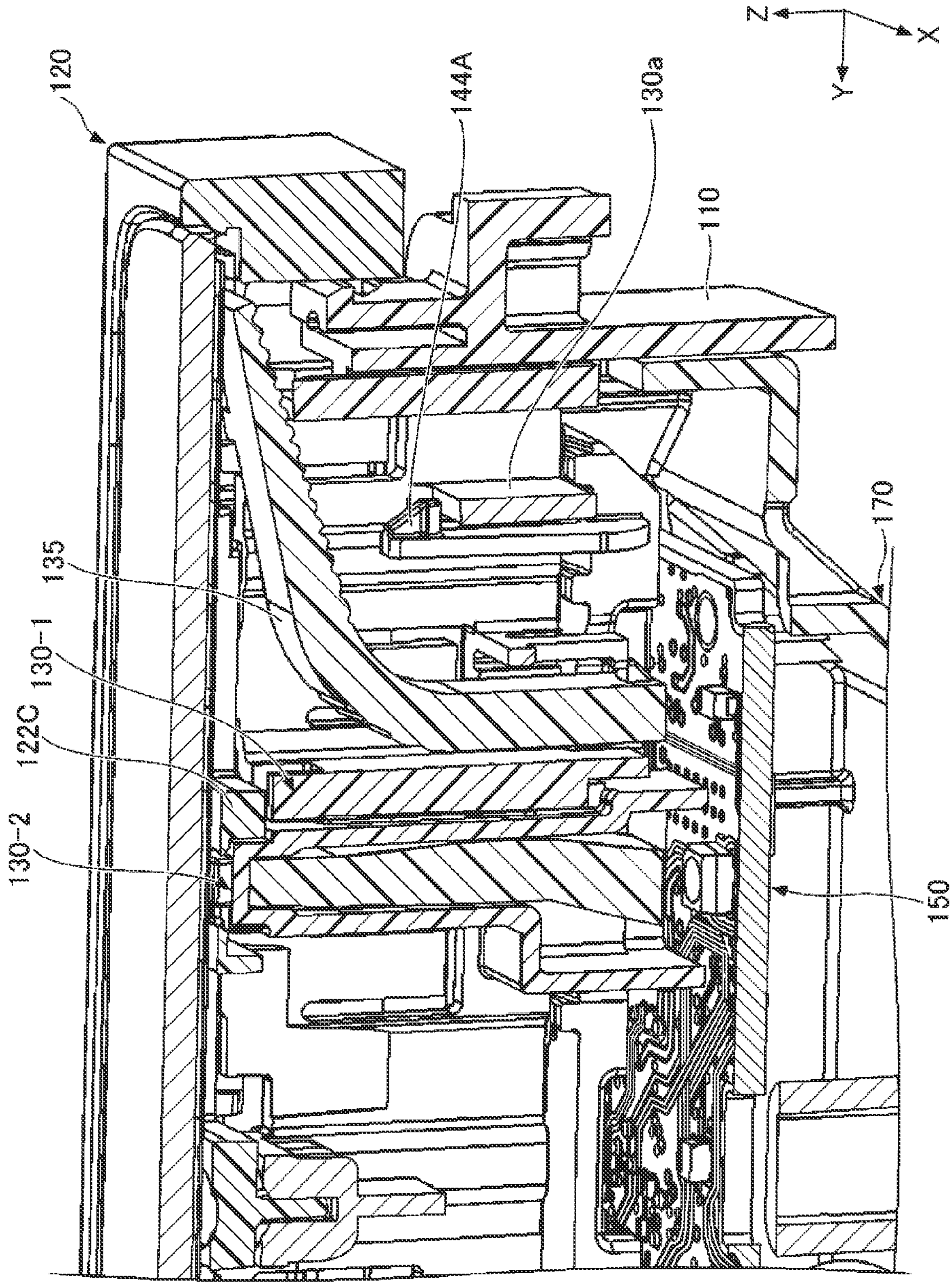
FIG. 9 is a partially enlarged cross-sectional perspective view of an input device according to one embodiment.
Figure 10:
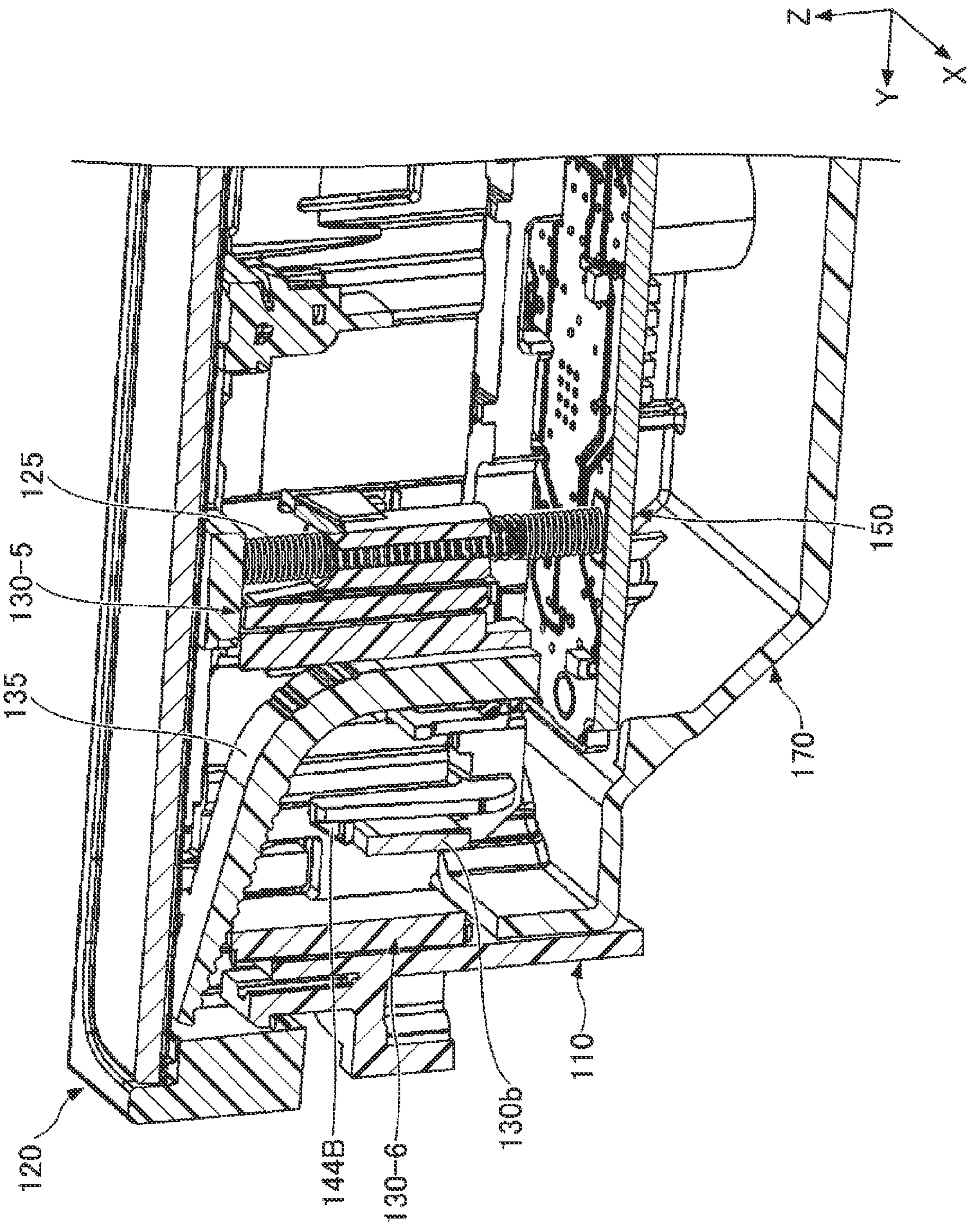
FIG. 10 is a partially enlarged cross-sectional perspective view of an input device according to one embodiment.

FIG. 7 is an external perspective view of the transmission member 140 included in the input device 100 according to one embodiment. FIG. 8 illustrates the positional relationship between the slider 130 and the transmission member 140 in the input device 100 according to one embodiment. FIGS. 9 and 10 are partially enlarged cross-sectional perspective views of the input device 100 according to one embodiment.

As illustrated in FIG. 7, the front end of the transmission member 140 is provided with a plurality of pressed portions 142 protruding forward (in the positive X-axis direction) and arranged in the left-right direction (the Y-axis direction). The plurality of pressed portions 142 each have a flat plate shape that is substantially horizontal to the XY plane. As illustrated in FIG. 8, when the plurality of sliders 130 are disposed on the front side (the X-axis side) of the transmission member 140, the pressed portion 142 having the upper surface (the positive Z-axis direction) that is to be pressed by the contact portion 130*c* of the slider 130 is disposed below each of the plurality of sliders 130.

As illustrated in FIGS. 5 and 7, the front end surface of the transmission member 140 has a pressing portion 143 that protrudes forward (in the positive X-axis direction). The pressing portion 143 has a flat plate shape generally horizontal to the XY plane. The pressing portion 143 is disposed above the switch 151A mounted on the substrate 150 so as to face the switch 151A. The lower surface (in the negative Z-axis direction) of the pressing portion 143 presses the switch 151A.

As a result, even when any one of the plurality of sliders 130 corresponding to the pressure position has moved downward by a pressing operation, the input device 100 according to one embodiment can press down the pressed portions 142 by the contact portion 130*c* of the slider 130 that has moved downward and, thus, rotate the transmission member 140 downward about the rotation center axis L serving as the rotation center. Since the transmission member 140 rotates downward about the rotation center axis L serving as the rotation center, the input device 100 according to one embodiment can press the switch 151A by the pressing portion 143 of the transmission member 140 and, thus, turn on the switch 151A.

That is, the input device 100 according to one embodiment includes the plurality of sliders 130 arranged in the left-right direction (the Y-axis direction) and the transmission member 140, so that even when any one of the plurality of pressing operation regions 124 is subjected to a pressing operation, only one of the sliders 130 that is the closest to the pressing operation region 124 subjected to the pressing operation is pressed down, and the transmission member 140 is pressed down by the slider 130. Therefore, when viewed from the direction of the rotation center axis L, the distance from the rotation center of the transmission member 140 to the point of effort can be kept substantially constant for any operation region and, thus, the transmission member 140 can be rotated by the same motion to turn on the one switch 151A. As a result, the switch 151A can be turned on smoothly with the same operation feel regardless of the selected pressing operation region.

As illustrated in FIG. 7, the transmission member 140 includes a columnar hook 144A (an example of a "first engaging portion") extending upward (in the positive Z-axis direction) at the left (the negative Y-axis side) end. As illustrated in FIG. 9, the hook 144A is engaged with the upper end surface of a wall-shaped engaged portion 130*a* formed inside of the slider 130-1 (an example of a "slide member on one end"). When the transmission member 140 is rotated, the hook 144A can pull the slider 130-1 downward.

In addition, the transmission member 140 includes a columnar hook 144B (an example of a "second engaging portion") extending upward (in the positive Z-axis direction) at the right (positive Y-axis side) end. As illustrated in FIG. 10, the hook 144B is engaged with the upper end surface of a wall-shaped engaged portion 130*b* formed inside of the slider 130-6 (an example of a "slide member at the other end"). When the transmission member 140 is rotated, the hook 144B can pull the slider 130-6 downward.

As a result, the input device 100 according to one embodiment, when one end of the touch panel 120 is subjected to a pressing operation and the slider 130-1 at one end is pressed down and, thus, a height difference with the other end of the touch panel 120 is about to occur, the hook 144B of the transmission member 140 that has been pressed down by the slider 130-1 and has been rotated can pull the slider 130-6 at the other end downward. As a result, in the input device 100 according to one embodiment, the slider 130-1 at one end and the slider 130-6 at the other end can move downward together, allowing the touch panel 120 to move downward while keeping the touch panel 120 horizontal.

In contrast, in the input device 100 according to one embodiment, when the other end of the touch panel 120 is subjected to a pressing operation and the slider 130-6 at the other end is pressed down and, thus, a height difference with the one end of the touch panel 120 is about to occur, the hook 144A of the transmission member 140 that has been pressed down by the slider 130-6 and has been rotated can pull the slider 130-1 at the one end downward. As a result, in the input device 100 according to one embodiment, the slider 130-1 at the one end and the slider 130-6 at the other end can move downward together, allowing the touch panel 120 to move downward while keeping the touch panel 120 horizontal. The configuration to pull the slider 130 downward by the hooks 144A and 144B of the transmission member 140 is not essential for providing uniform operation feel regarding the pressure location. This configuration can reduce the height difference between the two ends of the touch panel 120 more when an end portion of the touch panel 120 is pressed and can move the touch panel 120 downward while reliably keeping the touch panel 120 horizontal.

Configuration of Sliders

The configuration of each of the sliders 130 included in the input device 100 is described in more detail below with reference to typical examples (the three sliders 130-1, 130-2, and 130-3) in FIGS. 11 and 12.

Figure 11:
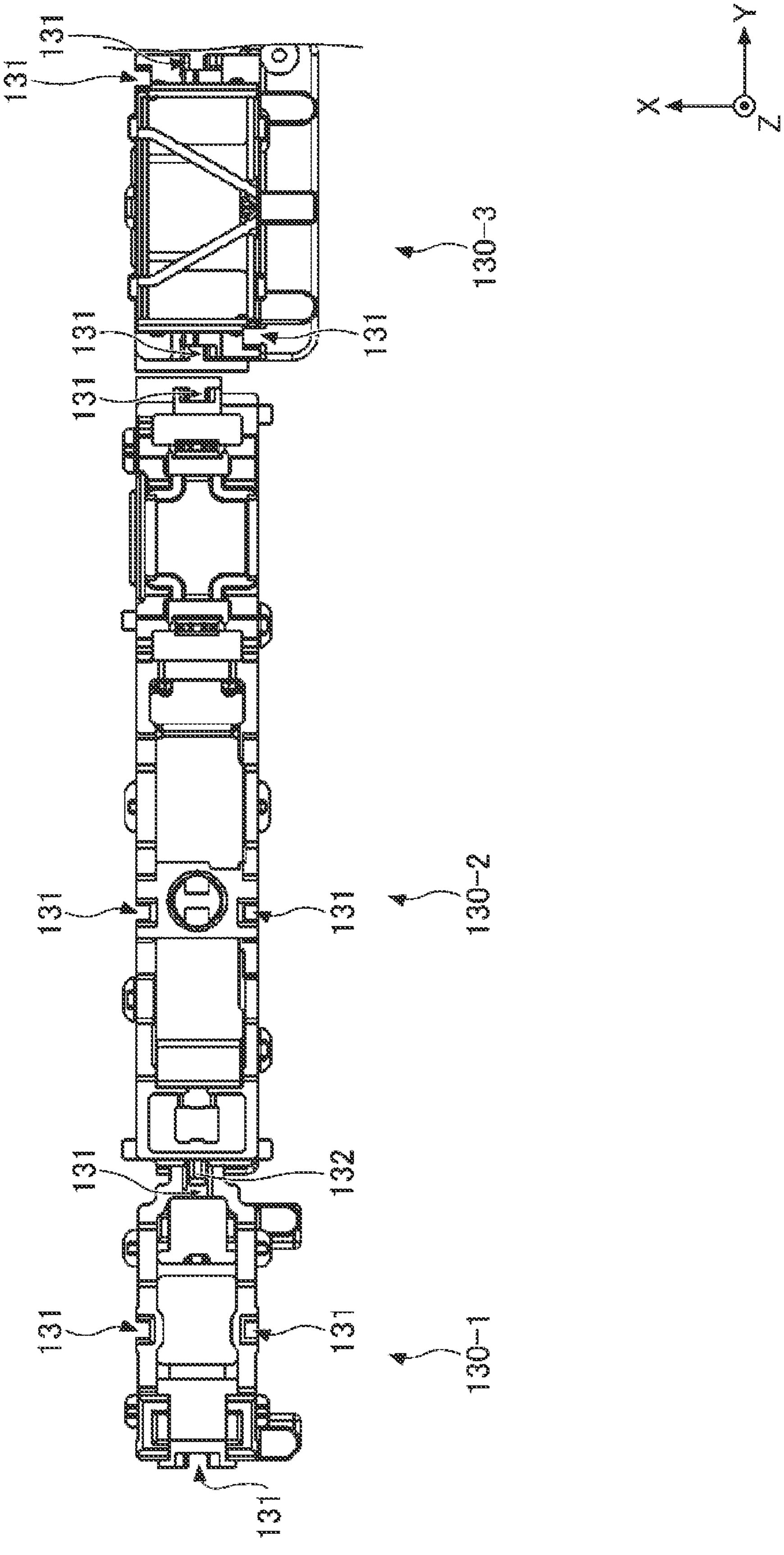
FIG. 11 is a plan view of three sliders of an input device according to one embodiment.

FIG. 11 is a plan view of the three sliders 130-1, 130-2, 130-3 included in the input device 100 according to one embodiment. FIG. 12 is a plan view of the three sliders 130-1, 130-2, 130-3 (disposed inside of the tubular portion 111 of the chassis 110) included in the input device 100 according to one embodiment.

As illustrated in FIG. 11, the sliders 130-1, 130-2, and 130-3 are arranged in the Y-axis direction, and each of the sliders 130-1, 130-2, and 130-3 has a rectangular shape with the longitudinal direction extending in the left-right direction in plan view viewed from above.

The slider 130-1 has a groove-like guide groove 131 (an example of a "guided portion") extending in the up-down direction (the Z-axis direction) on each of its front side (positive X-axis side) surface, rear side (negative X-axis side) surface, right side (positive Y-axis side) surface, and left side (negative Y-axis side) surface.

The slider 130-2 has the groove-like guide groove 131 (the example of the "guided portion") extending in the up-down direction (the Z-axis direction) on each of its front side (positive X-axis side) surface, rear side (negative X-axis side) surface, and right side (positive Y-axis side) surface. In addition, the slider 130-2 has a convex guide protrusion 132 (an example of a "guided portion") extending in the up-down direction (the Z-axis direction) on its left side (negative Y-axis side) surface.

The slider 130-3 has a groove-like guide groove 131 (an example of a "guided portion") extending in the up-down direction (the Z-axis direction) on each of its front side (positive X-axis side) surface, the rear side (negative X-axis side) surface, the right side (positive Y-axis side) surface, and left side (negative Y-axis side) surface.

Each of the guide grooves 131 is provided so as to have a maximized length in the up-down direction. A notch may be provided in the substrate 150, and the guide groove 131 may be provided so as to pass through the substrate 150 (refer to part A in FIG. 14). This allows the slider 130 to slide up and down more smoothly without tilting, even when pressed in an oblique direction.

Figure 12:
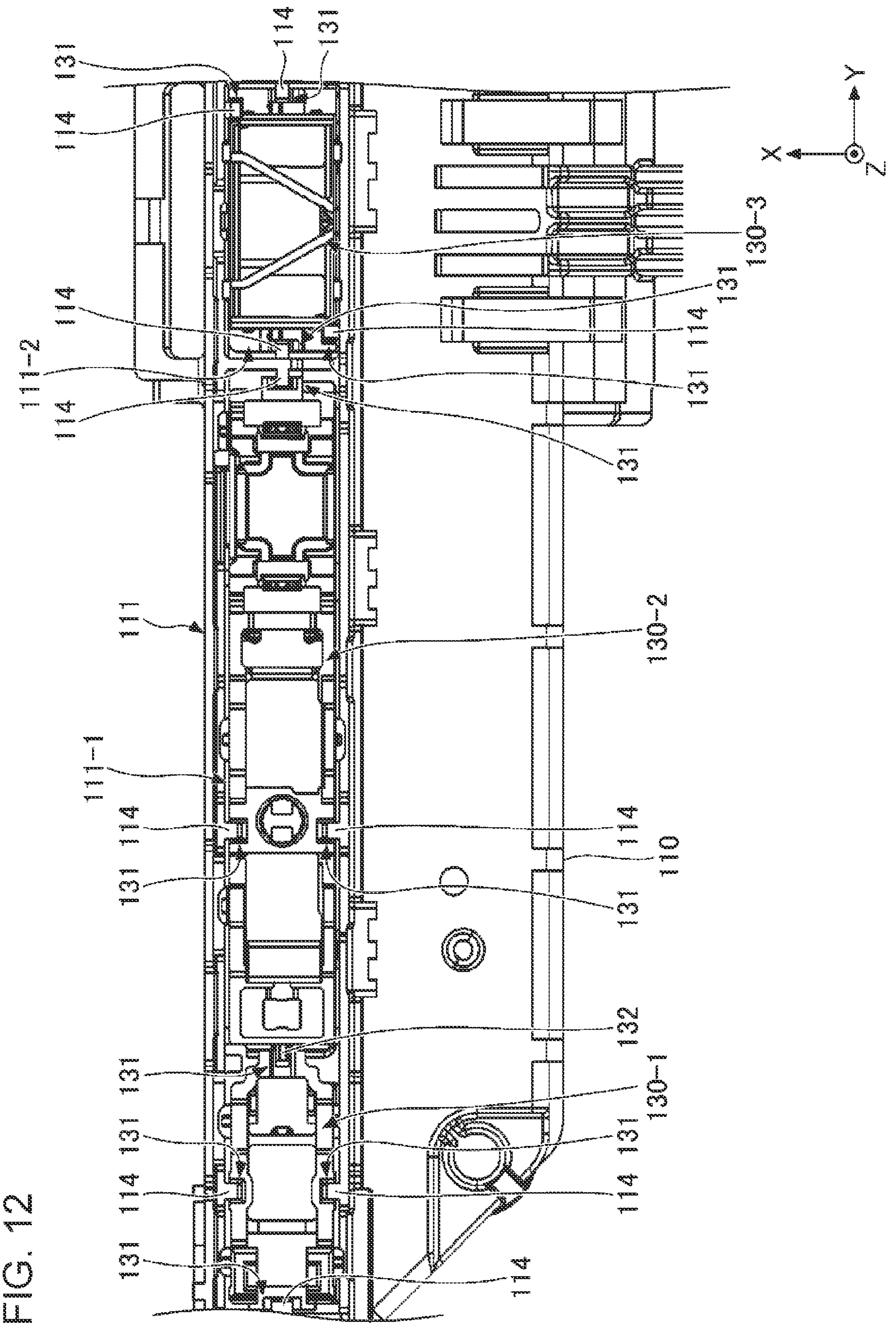
FIG. 12 is a plan view of three sliders (disposed inside of a tubular portion of a chassis) of an input device according to one embodiment.

As illustrated in FIG. 12, the slider 130-1 is disposed inside of the first tubular portion 111-1 of the tubular portion 111 of the chassis 110. Each of the three guide grooves 131 on the front side (positive X-axis side) surface, rear side (negative X-axis side) surface, and left side (negative Y-axis side) surface of the slider 130-1 is engaged with one of three guide protrusions 114 formed on the inner wall surface of the first tubular portion 111-1 of the chassis 110. One guide groove 131 on the right side (positive Y-axis side) surface of slider 130-1 is engaged with one guide protrusion 132 formed on the left side surface of the slider 130-2. As a result, one of the guide protrusions 114 or the guide protrusion 132 slides in the up-down direction (the Z-axis direction) inside of each of the four guide grooves 131 and, thus, the slider 130-1 is guided to move in the up-down direction (the Z-axis direction).

The slider 130-2 is disposed inside of the first tubular portion 111-1 of the tubular portion 111 of the chassis 110. Each of the three guide grooves 131 on the front side (positive X-axis side) surface, rear side (negative X-axis side) surface, and right side (positive Y-axis side) surface of the slider 130-2 is engaged with one of the three guide protrusions 114 formed on the inner wall surface of the first tubular portion 111-1 of the chassis 110. One guide protrusion 132 on the left side (negative Y-axis side) surface of the slider 130-2 is engaged with one guide groove 131 formed on the right side surface of slider 130-1. As a result, one of the guide protrusions 114 slides in the up-down direction (the Z-axis direction) inside each of the three guide grooves 131, and the guide protrusion 132 slides in the up-down direction (the Z-axis direction) inside of one guide groove 131. Thus, the slider 130-2 is guided to move in the up-down direction (the Z-axis direction).

The slider 130-3 is disposed inside of the second tubular portion 111-2 of the tubular portion 111 of the chassis 110. Each of the four guide grooves 131 on the front side (positive X-axis side) surface, rear side (negative X-axis side) surface, left side (negative Y-axis side) surface, and right side (positive Y-axis side) surface of the slider 130-3 is engaged with one of the four guide protrusions 114 formed on the inner wall surface of the second tubular portion 111-2 of the chassis 110. As a result, one of the guide protrusions 114 slides in the up-down direction (the Z-axis direction) inside each of the four guide grooves 131 and, thus, the slider 130-3 is guided to move in the up-down direction (the Z-axis direction).

Similarly, each of the sliders 130-4 to 130-6 has the guide groove 131 formed on each of the four side surfaces thereof, and each of the guide grooves 131 is engaged with the guide protrusion 114 on the tubular portion 111 of the chassis 110 (or the guide protrusion 132 of the neighboring slider 130) and, thus, the sliders 130-4 to 130-6 are guided to move in the up-down direction (the Z-axis direction).

As described above, the input device 100 according to one embodiment includes the six sliders 130-1 to 130-6 arranged in the left-right direction (the Y-axis direction) inside of the tubular portion 111 of the chassis 110 for the operation surface 120A that is horizontally long in the left-right direction (the Y-axis direction). That is, the input device 100 according to one embodiment does not include a single slider that is horizontally long in the left-right direction (the Y-axis direction) inside the tubular portion 111 of the chassis 110, but includes the six sliders 130-2 to 130-6 separated in the left-right direction (the Y-axis direction). The guide groove 131 on each of the four side surfaces of each of the six sliders 130-1 to 130-6 is engaged with the guide protrusion 114 in the tubular portion 111 of the chassis 110 (or the guide protrusion 132 of the neighboring slider 130). Thus, the sliders 130-1 to 130-6 are guided to move in the up-down direction (the Z-axis direction).

As a result, the input device 100 according to one embodiment can reduce the width in the left-right direction of each of the six sliders 130-2 to 130-6, so that when a pressing operation is performed on any one of the pressing operation regions 124, only the closest slider 130 corresponding to the pressing operation region 124 can be pressed down. In this case, since the width in the left-right direction of the slider 130 is small, the distance between the pressing operation position and the guided portion of the slider 130 can be reduced and, thus, the rotational moment generated in the slider 130 can be reduced, and the slider 130 can be moved up and down smoothly. As a result, the variation in operation feel can be reduced regardless of the pressure position.

Configuration of Light Guide

Figure 13:
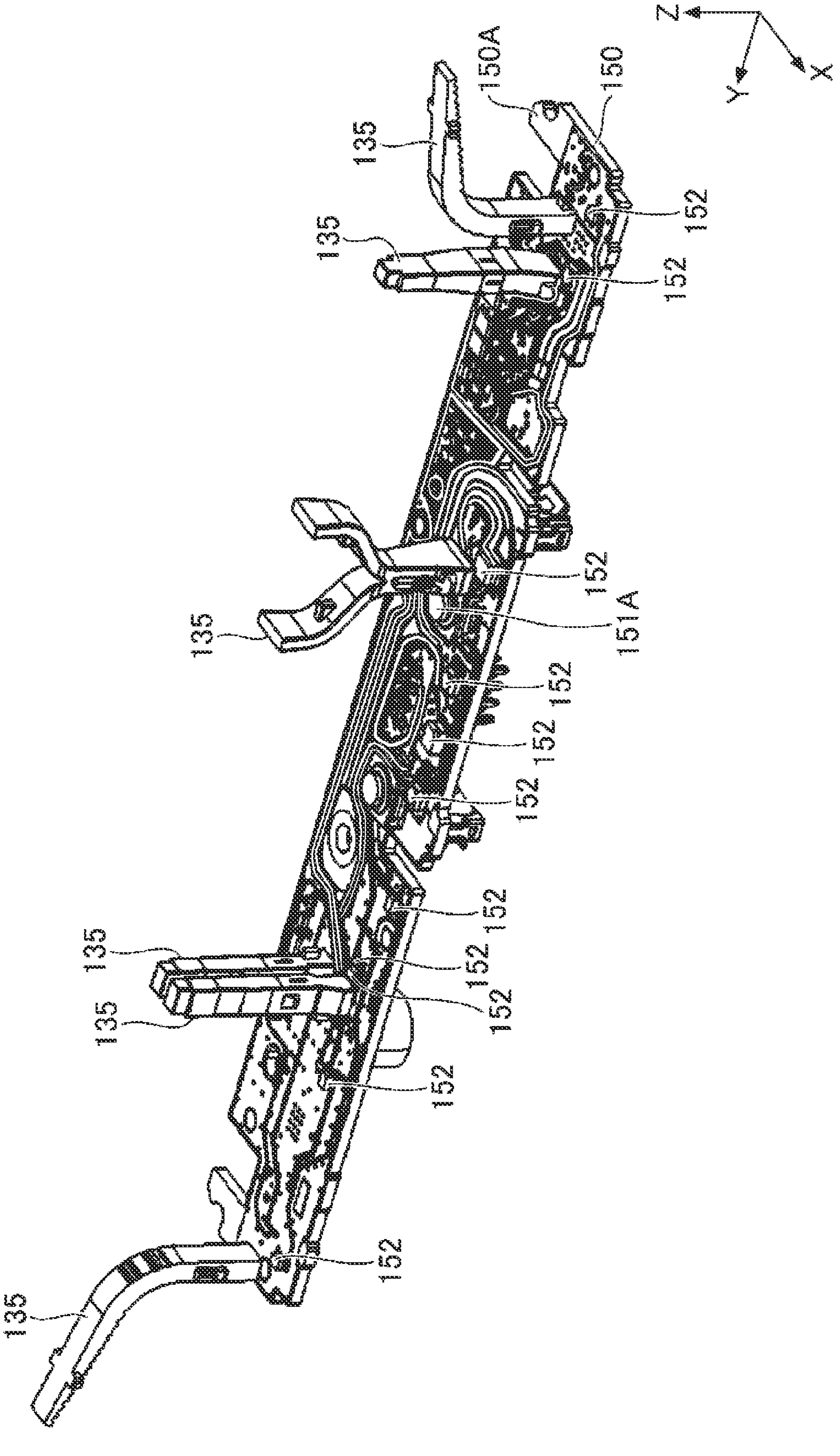
FIG. 13 illustrates a positional relationship between an LED and a light guide in an input device according to one embodiment.
Figure 14:
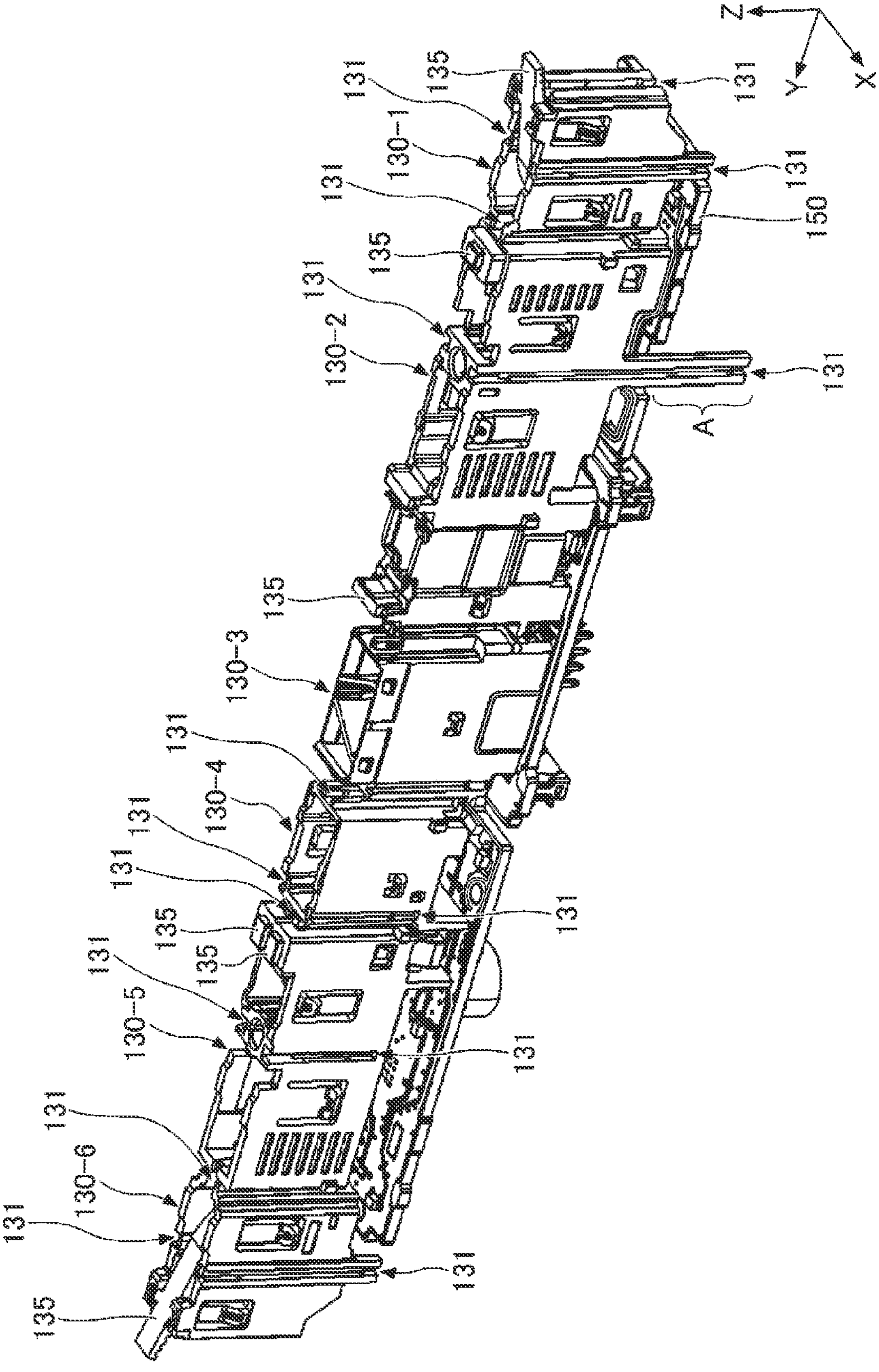
FIG. 14 illustrates a positional relationship between an LED and a light guide (incorporated into a slider) in an input device according to one embodiment.

FIG. 13 illustrates the positional relationship among the LEDs 152 and light guides 135 in the input device 100 according to one embodiment. FIG. 14 illustrates the positional relationship among the LEDs 152 and the light guides 135 (incorporated in the slider 130) in the input device 100 according to one embodiment.

As illustrated in FIG. 13, the switch 151A and the plurality of LEDs (Light Emitting Diodes) 152 are mounted on the upper surface 150A of the substrate 150. The switch 151A is mounted in the substantial center portion in the left-right direction (the Y-axis direction).

Each of the plurality of sliders 130 (except for the slider 130-3) incorporates the light guide 135 so that the light guide 135 penetrates the slider 130 in the up-down direction (the Z-axis direction). The light guide 135 is a rectangular pillar-shaped resin component.

Some of the LEDs 152 are disposed directly below the light guides 135, respectively. Some of the LEDs 152 can emit light into the light guide 135 when emitting light. As a result, the light from some of the other LEDs 152 propagates inside the light guides 135 (an example of a "light guide portion") and is emitted to a specific pressing operation region 124 of the touch panel 120 without leaking to the other neighboring sliders 130.

Some of the other LEDs 152 are located directly below the space of the sliders 130. The some of the other LEDs 152 can emit light into the space of the sliders 130 when emitting light. This allows light from the some of the other LEDs 152 to propagate within the space of the sliders 130 (another example of a "light guide portion") and to be emitted directly onto the specific pressing operation regions 124 of the touch panel 120 without leaking to other neighboring sliders 130.

The input device 100 according to one embodiment includes the plurality of sliders 130, so that the interior of the tubular portion 111 of the chassis 110 can be divided into a plurality of spaces by the plurality of sliders 130. Therefore, since the light emitted from the LED 152 to a specific pressing operation region 124 is guided to the specific pressing operation region 124 through a corresponding one of the sliders 130, the input device 100 according to one embodiment can reduce the light that leaks into other neighboring pressing operation regions 124.

Effects

As described above, the input device 100 according to one embodiment includes the chassis 110, the switch 151A provided inside of the chassis 110, the touch panel 120 provided in a movable manner relative to the chassis 110 in the up-down direction, where the touch panel 120 is exposed on the chassis 110 and has a plurality of pressing operation regions 124, the slider 130 that includes a guided portion guided by the chassis 110 in a movable manner in the up-down direction and that moves in a downward direction in accordance with a pressing operation performed on the pressing operation region 124 of the touch panel 120, and the transmission member 140 that is supported by the chassis 110 in a rotatable manner and that rotates in accordance with the downward movement of the slider 130 and presses the switch 151A to turn on the switch 151A. The slider 130 is provided in a plurality, and each of the sliders 130 corresponds to one of the plurality of pressing operation regions 124 of the touch panel 120.

As a result, since the input device 100 according to one embodiment includes a plurality of separated sliders 130 each being moved downward in accordance with a pressing operation performed on the pressing operation region 124 of the touch panel 120, the distance between the guided portions of the sliders 130 is decreased as compared with existing input devices in which sliders are integrated into one. Therefore, even when an off-center position on the touch panel 120 is subjected to a pressing operation, the input device 100 according to one embodiment can move only one slider 130 directly below the pressing operation position downward. Since the guided portion of the slider 130 is close to the pressing operation position, generation of a rotational moment of the slider 130 can be reduced, and the slider 130 can be easily slid downward. Therefore, according to the input device 100 of one embodiment, when a off-center position on the touch panel 120 is subjected to a pressing operation, generation of the rotational moment of the slider 130 can be reduced, and the load related to the pressing operation can be reduced. That is, according to the input device 100 of one embodiment, since the slider 130 is divided into a plurality of sliders, a substantially uniform operation load can be obtained regardless of the pressing operation position of the touch panel 120.

In addition, according to the input device 100 of one embodiment, the plurality of pressing operation regions 124 and the plurality of sliders 130 may be arranged along a direction of the rotation center axis L of the transmission member 140.

As a result, the input device 100 according to one embodiment can make the distance from the rotation center of the transmission member 140 to the point of effort can be kept substantially constant regardless of the pressing operation position of the touch panel 120. That is, the input device 100 can turn on the switch 151A with a substantially constant operating force regardless of the pressing operation position of the touch panel 120.

In the input device 100 according to one embodiment, the transmission member 140 may include the hook 144A (the first engaging portion) that is engaged with the slider 130-1 at one end in the direction of the rotation center axis L of the transmission member 140 and that is capable of pulling, in the downward direction, the slider 130-1 at the one end at a time of the rotation and the hook 144B (a second engaging portion) that is engaged with the slider 130-6 at the other end in the direction of the rotation center axis L of the transmission member 140 and that is capable of pulling, in the downward direction, the slider 130-6 at the other end at a time of the rotation.

As a result, in the input device 100 according to one embodiment, when one end of the touch panel 120 is subjected to a pressing operation and, thus, the slider 130-1 at the one end is pressed down and a height difference with the other end of the touch panel 120 is about to occur, the hook 144B of the transmission member 140 that has been pressed down by the slider 130-1 and has rotated can pull down the slider 130-6 at the other end. As a result, the input device 100 according to one embodiment can move the slider 130-1 at one end and the slider 130-6 at the other end together downward, which can move the touch panel 120 downward while keeping the touch panel 120 horizontal.

In contrast, in the input device 100 according to one embodiment, when the other end of the touch panel 120 is subjected to a pressing operation and, thus, the slider 130-6 at the other end is pressed down and a height difference with the one end of the touch panel 120 is about to occur, the hook 144A of the transmission member 140 that has been pressed down by the slider 130-6 and has rotated can pull down the slider 130-1 at one end. As a result, the input device 100 according to one embodiment can move the slider 130-1 at one end and the slider 130-6 at the other end together downward, which can move the touch panel 120 downward while keeping the touch panel 120 horizontal. This configuration reduces the height difference between the two ends of the touch panel 120 more when an end of the touch panel 120 is pressed. Thus, the touch panel 120 can be moved downward with the touch panel 120 reliably kept horizontal.

While one embodiment of the present invention has been described in detail above, the present invention is not limited to these embodiments, and various modifications or changes can be made within the scope of the invention described in the attached claims.

For example, according to one embodiment, the number of sliders 130 is the same as the number of the pressing operation regions 124. However, the configuration is not limited thereto. That is, the number of sliders 130 may be less than the number of the pressing operation regions 124 or greater than the number of the pressing operation regions 124.

For example, according to one embodiment, a guide groove is used as the "guided portion," but the configuration is not limited thereto. For example, a guide protrusion or the like may be used as the "guided portion," and the mating structure may be a groove.

For example, according to one embodiment, the hooks 144A and 144B of the transmission member 140 are engaged with the sliders 130 at both ends, and the touch panel 120 is moved downward while both the ends of the touch panel 120 kept horizontal. However, the configuration is not limited thereto. For example, the hooks 144A and 144B may be directly engaged with both end portions of the touch panel 120, and the touch panel 120 may be moved downward with the touch panel 120 kept horizontal.

For example, according to one embodiment, the hooks 144A and 144B of the transmission member 140 are engaged with the sliders 130 at both ends and are moved downward and, thus, the touch panel 120 is moved downward with the touch panel 120 kept horizontal. However, the configuration is not limited thereto. For example, the input device 100 may be installed in such a direction that the sliders 130 move downward under their own weights, and each of the sliders 130 may be moved downward under its own weight to fill the gap with the transmission member 140 that rotates. Thus, the touch panel 120 may be moved downward with the touch panel 120 kept horizontal, without providing the hooks 144A and 144B of the transmission member 140.

For example, according to one embodiment, by engaging the hooks 144A and 144B of the transmission member 140 with the sliders 130 at both ends and moving the sliders 130 downward, the touch panel 120 is moved downward with the touch panel 120 kept horizontal. However, the configuration is not limited thereto. For example, by engaging the hook 144A and hook 144B with all the sliders 130 and moving the sliders 130 downward, the touch panel 120 may be moved downward with the touch panel 120 kept horizontal.

What is claimed is:

1. An input device comprising: a chassis; a switch member provided inside of the chassis; a touch panel provided in a movable manner relative to the chassis in an up-down direction, the touch panel being exposed on the chassis and having a plurality of pressing operation regions; a slide member including a guided portion guided by the chassis in a movable manner in the up-down direction, the slide member moving in a downward direction in accordance with a pressing operation performed on the pressing operation region of the touch panel; and a transmission member supported by the chassis in a rotatable manner, the transmission member rotating in accordance with movement of the slide member in the downward direction and pressing the switch member to turn on the switch member, wherein the slide member is provided in a plurality, and each of the slide members corresponds to one of the plurality of pressing operation regions of the touch panel; wherein the plurality of pressing operation regions and the plurality of slide members are arranged along a direction of a rotation center axis of the transmission member.

2. The input device according to claim 1, wherein the transmission member includes a first engaging portion that is engaged with the slide member at one end in the direction of the rotation center axis or a portion of the touch panel at the one end in the direction of the rotation center axis and that is capable of pulling, in the downward direction, the slide member at the one end or the portion of the touch panel at the one end in the direction of the rotation center axis at a time of the rotation and a second engaging portion that is engaged with the slide member at the other end in the direction of the rotation center axis or a portion of the touch panel at the other end in the direction of the rotation center axis and that is capable of pulling, in the downward direction, the slide member at the other end or the portion of the touch panel at the other end in the direction of the rotation center axis at a time of the rotation.

3. The input device according to claim 1, wherein each of the plurality of slide members includes a light guide portion that guides light emitted from a light emitter to a corresponding one of the pressing operation regions of the touch panel.

4. The input device according to claim 1, wherein the guided portion has a groove-like shape that extends in the up-down direction, and a protrusion provided on the chassis slides inside of the guided portion in the up-down direction so that the guided portion is guided in the up-down direction.

5. The input device according to claim 1, wherein the transmission member includes a pressed portion below each of the plurality of slide members, and the pressed portion is configured to be pressed down by the slide member.

6. The input device according to claim 1, wherein the touch panel includes a horizontal plate portion stacked on an upper surface of each of the plurality of slide members, and wherein when a pressing operation is performed on the pressing operation region, the horizontal plate portion presses down the slide member located at a position corresponding to a position at which the pressing operation is performed.

* * * * *